US008958143B2

(12) United States Patent
Hou et al.

(10) Patent No.: US 8,958,143 B2
(45) Date of Patent: Feb. 17, 2015

(54) MASTER OSCILLATOR—POWER AMPLIFIER DRIVE LASER WITH PRE-PULSE FOR EUV LIGHT SOURCE

(71) Applicant: CYMER, LLC, San Diego, CA (US)

(72) Inventors: Kai-Chung Hou, San Diego, CA (US); Richard L. Sandstrom, Encinitas, CA (US); William N. Partlo, Poway, CA (US); Daniel J. W. Brown, San Diego, CA (US); Igor V. Fomenkov, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/171,492

(22) Filed: Feb. 3, 2014

(65) Prior Publication Data

US 2014/0146387 A1     May 29, 2014

Related U.S. Application Data

(63) Continuation of application No. 13/077,236, filed on Mar. 31, 2011, now Pat. No. 8,654,438.

(60) Provisional application No. 61/398,452, filed on Jun. 24, 2010.

(51) Int. Cl.
*H05G 2/00*     (2006.01)

(52) U.S. Cl.
USPC ........................................ 359/333; 250/504 R

(58) Field of Classification Search
USPC ................................ 359/333, 349; 250/504 R
See application file for complete search history.

(56) References Cited

U.S. PATENT DOCUMENTS

| | | | |
|---|---|---|---|
| 7,491,954 B2* | 2/2009 | Bykanov et al. | 250/504 R |
| 8,363,312 B1* | 1/2013 | Honea et al. | 359/341.41 |
| 2006/0078257 A1* | 4/2006 | Park et al. | 385/37 |
| 2009/0267005 A1* | 10/2009 | Bykanov et al. | 250/504 R |
| 2010/0046950 A1* | 2/2010 | Cao et al. | 398/79 |
| 2010/0127191 A1* | 5/2010 | Partlo et al. | 250/504 R |

\* cited by examiner

*Primary Examiner* — Mark Hellner

(57) ABSTRACT

A device is described herein which may comprise an optical amplifier having a gain band including wavelengths $\lambda_1$ and $\lambda_2$, with $\lambda_1 \neq \lambda_2$; a pre-pulse seed laser having a tuning module for tuning a pre-pulse output to wavelength $\lambda_1$; a main pulse seed laser generating a laser output having wavelength, $\lambda_2$; and a beam combiner for directing the pre-pulse output and the main pulse output on a common path through the optical amplifier.

19 Claims, 12 Drawing Sheets

Table 1

| LINE | Wavelength (μm) | P (watts) | P/P (10P20) | Relative Gain | Predicted g0 |
|---|---|---|---|---|---|
| 9R(42) | 9.1656440 | | | | |
| 40 | 9.1740695 | | | | |
| 38 | 9.1827244 | | | | |
| 36 | 9.1916114 | 3.55 | 0.361139369 | 0.383180061 | 0.455984273 |
| 34 | 9.2007329 | 3.84 | 0.390640895 | 0.411663784 | 0.489879903 |
| 32 | 9.2100915 | 5.44 | 0.553407935 | 0.568815361 | 0.67689028 |
| 30 | 9.2196895 | 6.22 | 0.632756867 | 0.645426755 | 0.768057838 |
| 28 | 9.2295296 | 6.82 | 0.693794507 | 0.704358596 | 0.838186729 |
| 26 | 9.2396141 | 8.08 | 0.82197355 | 0.828115463 | 0.985457401 |
| 24 | 9.2499453 | 9.31 | 0.947100712 | 0.948925738 | 1.129221628 |
| 22 | 9.2605258 | 8.51 | 0.865717192 | 0.870349949 | 1.035716439 |
| 20 | 9.2713577 | 9.41 | 0.957273652 | 0.958747711 | 1.140909776 |
| 18 | 9.2824434 | 8.76 | 0.891149542 | 0.894904883 | 1.064936811 |
| 16 | 9.2937852 | 8.63 | 0.87792472 | 0.882136317 | 1.049742218 |
| 14 | 9.3053853 | 7.47 | 0.759918616 | 0.768201424 | 0.914159695 |
| 12 | 9.3172460 | 8.75 | 0.890132248 | 0.893922686 | 1.063767996 |
| 10 | 9.3293695 | 7.48 | 0.76093591 | 0.769183622 | 0.91532851 |
| 8 | 9.3417579 | 5.31 | 0.540183113 | 0.556046796 | 0.661695687 |
| 6 | 9.3544134 | 3.05 | 0.310274669 | 0.334070193 | 0.39754353 |
| 4 | 9.3673380 | | | | |
| | | | | | |

FIG.13

Table 2

| LINE | Wavelength (μm) | P (watts) | P/P (10P20) | Relative Gain | Predicted g0 |
|---|---|---|---|---|---|
| 10R(42) | 10.1148262 | 2.05 | 0.213319459 | 0.240459938 | 0.286147326 |
| 40 | 10.1253400 | 3.69 | 0.383975026 | 0.405227888 | 0.482221186 |
| 38 | 10.1361464 | 5.23 | 0.544224766 | 0.559949011 | 0.666339324 |
| 36 | 10.1472454 | 6.04 | 0.628511967 | 0.641328304 | 0.763180682 |
| 34 | 10.1586374 | 7.09 | 0.737773153 | 0.746819979 | 0.888715775 |
| 32 | 10.1703225 | 7.47 | 0.777315297 | 0.784997919 | 0.934147523 |
| 30 | 10.1823014 | 8.23 | 08.56399584 | 0.861353798 | 1.02501102 |
| 28 | 10.1945745 | 9.02 | 0.938605619 | 0.940723725 | 1.119461233 |
| 26 | 10.2071425 | 9.32 | 0.969823101 | 0.970864204 | 1.155328403 |
| 24 | 10.2200062 | 9.52 | 0.990634755 | 0.990957856 | 1.179239849 |
| 22 | 10.2331666 | 9.68 | 1.007284079 | 1.007032778 | 1.198369006 |
| 20 | 10.2466246 | 9.83 | 1.02289282 | 1.022103018 | 1.216302591 |
| 18 | 10.2603814 | 9.73 | 1.012486993 | 1.012056191 | 1.204346868 |
| 16 | 10.2744384 | 9.50 | 0.98855359 | 0.988948491 | 1.176848704 |
| 14 | 10.2887967 | 9.65 | 1.004162331 | 1.00401873 | 1.194782289 |
| 12 | 10.3034581 | 8.90 | 0.926118626 | 0.928667534 | 1.105114365 |
| 10 | 10.3184241 | 8.63 | 0.898022893 | 0.901541103 | 1.072833913 |
| 8 | 10.3336965 | 7.71 | 0.802289282 | 0.809110302 | 0.962841259 |
| 6 | 10.3492772 | 6.96 | 0.724245578 | 0.733759105 | 0.873173335 |
| 4 | 10.3651683 | 4.80 | 0.499479709 | 0.516747659 | 0.614929714 |
|  |  |  |  |  |  |

FIG.14

Table 3

| LINE | Wavelength (μm) | P (watts) | P/P (10P20) | Relative Gain | Predicted g0 |
|---|---|---|---|---|---|
| 9P(6) | 9.4433275 | 2.65 | 0.275754422 | 0.300740895 | 0.357881665 |
| 8 | 9.4580515 | 4.92 | 0.511966701 | 0.52880385 | 0.629276582 |
| 10 | 9.4730598 | 6.35 | 0.660770031 | 0.672473465 | 0.800243424 |
| 12 | 9.4883540 | 8.01 | 0.833506764 | 0.83925078 | 0.998708429 |
| 14 | 9.5039361 | 8.35 | 0.868886576 | 0.87340999 | 1.039357888 |
| 16 | 9.5198079 | 9.40 | 0.978147763 | 0.978901665 | 1.164892981 |
| 18 | 9.5359711 | 10.09 | 1.049947971 | 1.048224766 | 1.247387471 |
| 20 | 9.5524276 | 9.97 | 1.037460978 | 1.036168574 | 1.233040604 |
| 22 | 9.5691788 | 9.67 | 1.006243496 | 1.006028096 | 1.197173434 |
| 24 | 9.5882267 | 10.42 | 1.084287201 | 1.081379292 | 1.286841358 |
| 26 | 9.6035727 | 10.02 | 1.042663892 | 1.041191988 | 1.239018465 |
| 28 | 9.6212185 | 9.28 | 0.96566077 | 0.966845473 | 1.150546113 |
| 30 | 9.6391656 | 8.73 | 0.90842872 | 0.911587929 | 1.084789636 |
| 32 | 9.6574156 | 7.76 | 0.807492196 | 0.814133715 | 0.968819121 |
| 34 | 9.6750700 | 7.24 | 0.753381894 | 0.761890219 | 0.90664936 |
| 36 | 9.6948301 | 6.67 | 0.694068678 | 0.704623309 | 0.838501738 |
| 38 | 9.7139973 | 5.06 | 0.52653486 | 0.542869407 | 0.646014594 |
| 40 | 9.7334730 | 3.98 | 0.414151925 | 0.434363684 | 0.516892784 |
| 42 | 9.7532586 | 3.24 | 0.337148803 | 0.36001717 | 0.428420432 |
| 44 | 9.7733552 | 2.28 | 0.237252862 | 0.263567638 | 0.313645489 |

FIG. 15

Table 4

| LINE | Wavelength (μm) | P (watts) | P/P (10P20) | Relative Gain | Predicted g0 |
|---|---|---|---|---|---|
| 10P(6) | 10.4582196 | 5.52 | 0.574401665 | 0.589084807 | 0.701010921 |
| 8 | 10.4761866 | 7.02 | 0.730489074 | 0.739787201 | 0.880346769 |
| 10 | 10.4944835 | 8.10 | 0.842872008 | 0.848292924 | 1.00946858 |
| 12 | 10.5131136 | 8.39 | 0.873048907 | 0.87742872 | 1.044140177 |
| 14 | 10.5320802 | 8.28 | 0.861602497 | 0.866377211 | 1.030988881 |
| 16 | 10.5513868 | 8.67 | 0.902185224 | 0.905559834 | 1.077616202 |
| 18 | 10.5710372 | 8.78 | 0.913631634 | 0.916611342 | 1.090767497 |
| 20 | 10.5910352 | 9.61 | 1 | 1 | 1.19 |
| 22 | 10.6113848 | 8.09 | 0.841831426 | 0.847288241 | 1.008273007 |
| 24 | 10.6320902 | 8.40 | 0.87408949 | 0.878433403 | 1.045335749 |
| 26 | 10.6531558 | 8.80 | 0.915712799 | 0.918620708 | 1.093158642 |
| 28 | 10.6745861 | 8.25 | 0.858480749 | 0.863363163 | 1.027402164 |
| 30 | 10.6963859 | 7.54 | 0.784599376 | 0.792030697 | 0.94251653 |
| 32 | 10.7185600 | 6.81 | 0.708636837 | 0.718688866 | 0.85523975 |
| 34 | 10.7411135 | 5.71 | 0.594172737 | 0.608173777 | 0.723726795 |
| 36 | 10.7640517 | 4.37 | 0.454734651 | 0.473546306 | 0.563520104 |
| 38 | 10.7873802 | 4.65 | 0.483870968 | 0.501677419 | 0.596996129 |
| 40 | 10.8111046 | 3.66 | 0.380853278 | 0.40221384 | 0.478634469 |
| 42 | 10.8352307 | 2.28 | 0.341311134 | 0.3640359 | 0.433202721 |
| 44 | 10.8597648 | 1.35 | 0.140478668 | 0.170132154 | 0.202457263 |
|  |  |  |  |  |  |

FIG.16

MASTER OSCILLATOR—POWER AMPLIFIER DRIVE LASER WITH PRE-PULSE FOR EUV LIGHT SOURCE

CROSS-REFERENCE TO RELATED APPLICATIONS

The present application is a continuation of U.S. patent application Ser. No. 13/077,236, filed on Mar. 31, 2011, and published on Dec. 29, 2011 as US-2011-0317256-A1, entitled MASTER OSCILLATOR-POWER AMPLIFIER DRIVE LASER WITH PRE-PULSE FOR EUV LIGHT SOURCE, which claims the benefit of U.S. Provisional Application No. 61/398,452, filed on Jun. 24, 2010, entitled MASTER OSCILLATOR-POWER AMPLIFIER DRIVE LASER WITH PRE-PULSE FOR EUV LIGHT SOURCE, the entire contents of all of which are hereby incorporated by reference herein.

The present application is related to U.S. patent application Ser. No. 12/004,905, filed on Dec. 20, 2007, entitled DRIVE LASER FOR EUV LIGHT SOURCE; U.S. patent application Ser. No. 11/786,145 filed on Apr. 10, 2007, entitled LASER PRODUCED PLASMA EUV LIGHT SOURCE; U.S. patent application Ser. No. 11/827,803 filed on Jul. 13, 2007, entitled LASER PRODUCED PLASMA EUV LIGHT SOURCE HAVING A DROPLET STREAM PRODUCED USING A MODULATED DISTURBANCE WAVE; U.S. patent application Ser. No. 11/358,988 filed on Feb. 21, 2006, entitled LASER PRODUCED PLASMA EUV LIGHT SOURCE WITH PRE-PULSE; U.S. patent application Ser. No. 11/067,124 filed on Feb. 25, 2005, entitled METHOD AND APPARATUS FOR EUV PLASMA SOURCE TARGET DELIVERY; U.S. patent application Ser. No. 11/174,443 filed on Jun. 29, 2005, entitled LPP EUV PLASMA SOURCE MATERIAL TARGET DELIVERY SYSTEM; U.S. patent application Ser. No. 11/358,983, filed on Feb. 21, 2006, entitled SOURCE MATERIAL DISPENSER FOR EUV LIGHT SOURCE; U.S. patent application Ser. No. 11/358,992 filed on Feb. 21, 2006, entitled LASER PRODUCED PLASMA EUV LIGHT SOURCE; U.S. patent application Ser. No. 11/174,299 filed on Jun. 29, 2005, entitled, LPP EUV LIGHT SOURCE DRIVE LASER SYSTEM; U.S. patent application Ser. No. 11/406,216 filed on Apr. 17, 2006 entitled ALTERNATIVE FUELS FOR EUV LIGHT SOURCE; U.S. patent application Ser. No. 11/580,414 filed on Oct. 13, 2006 entitled, DRIVE LASER DELIVERY SYSTEMS FOR EUV LIGHT SOURCE; U.S. patent application Ser. No. 11/644,153 filed on Dec. 22, 2006, entitled, LASER PRODUCED PLASMA EUV LIGHT SOURCE; U.S. patent application Ser. No. 11/505,177 filed on Aug. 16, 2006, entitled EUV OPTICS; U.S. patent application Ser. No. 11/452,558 filed on Jun. 14, 2006, entitled DRIVE LASER FOR EUV LIGHT SOURCE; U.S. Pat. No. 6,928,093, issued to Webb, et al., on Aug. 9, 2005, entitled LONG DELAY AND HIGH TIS PULSE STRETCHER; U.S. application Ser. No. 11/394,512, filed on Mar. 31, 2006, entitled CONFOCAL PULSE STRETCHER; U.S. application Ser. No. 11/138,001, filed on May 26, 2005, entitled SYSTEMS AND METHODS FOR IMPLEMENTING AN INTERACTION BETWEEN A LASER SHAPED AS A LINE BEAM AND A FILM DEPOSITED ON A SUBSTRATE; U.S. application Ser. No. 10/141,216, filed on May 7, 2002, now U.S. Pat. No. 6,693,939, entitled, LASER LITHOGRAPHY LIGHT SOURCE WITH BEAM DELIVERY; U.S. Pat. No. 6,625,191, issued to Knowles et al., on Sep. 23, 2003, entitled VERY NARROW BAND, TWO CHAMBER, HIGH REP RATE GAS DISCHARGE LASER SYSTEM; U.S. application Ser. No. 10/012,002; U.S. Pat. No. 6,549,551 issued to Ness, et al., on Apr. 15, 2003, entitled INJECTION SEEDED LASER WITH PRECISE TIMING CONTROL, U.S. application Ser. No. 09/848,043; U.S. Pat. No. 6,567,450 issued to Myers, et al., on May 20, 2003, entitled VERY NARROW BAND, TWO CHAMBER, HIGH REP RATE GAS DISCHARGE LASER SYSTEM, U.S. application Ser. No. 09/943,343; and U.S. patent application Ser. No. 11/509,925 filed on Aug. 25, 2006, entitled SOURCE MATERIAL COLLECTION UNIT FOR A LASER PRODUCED PLASMA EUV LIGHT SOURCE; the entire contents of each of which are hereby incorporated by reference herein.

FIELD

The present application relates to extreme ultraviolet ("EUV") light sources providing EUV light from a plasma created from a source material and collected and directed to a focus for utilization outside of the EUV light source chamber, e.g., for semiconductor integrated circuit manufacturing photolithography e.g., at wavelengths of around 100 nm and below.

BACKGROUND

Extreme ultraviolet ("EUV") light, e.g., electromagnetic radiation having wavelengths of around 5-100 nm or less (also sometimes referred to as soft x-rays), and including light at a wavelength of about 13 nm, can be used in photolithography processes to produce extremely small features in substrates, e.g., silicon wafers.

Methods to produce EUV light include, but are not necessarily limited to, converting a material into a plasma state that has an element, e.g., xenon, lithium or tin, with an emission line in the EUV range. In one such method, often termed laser produced plasma ("LPP"), the required plasma can be produced by irradiating a target material, for example in the form of a droplet, stream or cluster of material, with a laser beam.

For this process, the plasma is typically produced in a sealed vessel, e.g., vacuum chamber, and monitored using various types of metrology equipment. In addition to generating EUV radiation, these plasma processes also typically generate undesirable by-products in the plasma chamber which can include out-of-band radiation, high energy ions and debris, e.g., atoms and/or clumps/micro droplets of the target material.

These plasma formation by-products can potentially heat, damage or reduce the operational efficiency of the various plasma chamber optical elements including, but not limited to, collector mirrors including multi-layer mirrors (MLM's) capable of EUV reflection at normal incidence and/or grazing incidence mirrors, the surfaces of metrology detectors, windows used to image the plasma formation process, and laser input window(s). The heat, high energy ions and/or debris may be damaging to the optical elements in a number of ways, including coating them with materials which reduce light transmission, penetrating into them and, e.g., damaging structural integrity and/or optical properties, e.g., the ability of a mirror to reflect light at such short wavelengths, corroding or eroding them and/or diffusing into them. Thus, it is typically desirable to minimize the amount of and/or the effect of plasma generated debris.

Heretofore, LPP systems have been disclosed in which droplets in a droplet stream are irradiated by a separate laser pulse to form a plasma from each droplet. Also, systems have been disclosed in which each droplet is sequentially illuminated by more than one light pulses. In some cases, each droplet may be exposed to a so-called "pre-pulse" and a so-called "main pulse", however, it is to be appreciated that more than one pre-pulse may be used and more than one main pulse may be used, and that the functions of the pre-pulse and main pulse may overlap to some extent. Typically, the pre-pulse(s) may affect some or all of the target material to heat, expand, gasify, vaporize, ionize, generate a weak plasma and/or generate a strong plasma, and the main pulse(s) may function to convert most or all of the pre-pulse affected material into plasma and thereby produce an EUV light emission. In some cases, pre-pulsing may increase the efficiency of the material/pulse interaction due to a larger cross-section of material that is exposed to the main pulse, a greater penetration of the main pulse into the material due to the material's decreased density, or both. Another benefit of pre-pulsing is that it may expand the target to the size of the focused main pulse, allowing all of the main pulse to participate. This may be especially beneficial if relatively small droplets are used as targets and the irradiating light cannot be focused to the size of the small droplet. Thus, in some applications, it may be desirable to use pre-pulsing to increase conversion efficiency and/or allow use of relatively small, e.g., so-called, mass limited targets. The use to of relatively small targets, in turn, may be used to lower debris generation and/or reduce source material consumption.

With the above in mind, it may be desirable to use a specific pre-pulse energy to irradiate the target material. Several factors may affect the selection of this target pre-pulse energy including the size of the target material droplet and corresponding pre-pulse focal spot, the level of accuracy that is achievable in targeting the droplet with the pre-pulse, the pre-pulse pulse duration, the pre-pulse wavelength, the desired level of EUV output energy, EUV conversion efficiency, and prepulse and/or main pulse peak intensity.

As indicated above, one technique to produce EUV light involves irradiating a target material. In this regard, $CO_2$ lasers, e.g., outputting light at infra-red wavelengths, e.g. wavelengths in the range of about 9.2 μm to 11.2 μm, may present certain advantages as a drive laser irradiating a target material in an LPP process. This may be especially true for certain target materials, e.g., materials containing tin. For example, one advantage may include the ability to produce a relatively high conversion efficiency between the drive laser input power and the output EUV power. Another advantage of $CO_2$ drive lasers may include the ability of the relatively long wavelength light (for example, as compared to deep UV at 193 nm) to reflect from relatively rough surfaces such as a reflective optic that has been coated with tin debris. This property of 10.6 μm radiation may allow reflective mirrors to be employed near the plasma for, e.g., steering, focusing and/or adjusting the focal power of the drive laser beam.

In some cases, it may be desirable to employ a MoPa (Master Oscillator-Power Amplifier) arrangement to produce the relatively high power main pulses used in the LPP process. In this case, it may also be advantageous in certain circumstances to use some or all of the main pulse amplifier to amplify pre-pulses from a pre-pulse seed laser. In this case, it may be desirable to use a pre-pulse wavelength that does not substantially reduce the amplifier gain for the main-pulse wavelength. Other factors can effect the selection of wavelength for the main pulse and pre-pulse. For example, it is typically desired to use a main pulse wavelength that will produce the greatest amount of energy. Also, when lenses are used to focus the pulses, the amount of chromatic aberration that is tolerable may affect the selection of the main pulse and pre-pulse wavelengths. In addition, the use of dichroic beam splitters/combiners may also introduce limitations on main pulse/pre-pulse wavelength selection.

Lastly, other factors, such as the desire to use pre-pulses having a relatively large pulse rise-time may dictate the type of pre-pulse seed laser used (e.g. the gain media parameters, discharge type, optical cavity, etc.). Some types of seed lasers may only be operated to produce seed laser output pulse energies within a limited output energy range. For example, a range of pulse energies may exist outside of which the laser is unstable in that it may not be operated to produce consistent, repeatable laser parameters such as pulse energy. Although an attenuator may be positioned downstream of a seed laser to expand its operational range in some cases, the use of an attenuator can cause undesirable complications and may unnecessarily waste energy. In some cases, a range of pulse energies may exist outside of which suitable optics such as metrology detectors may not be available. These limitation of seed output pulse energy may, in turn, affect the selection of pre-pulse wavelength needed to produce the desired pre-pulse target energy at the droplet after amplification, since amplifier gain is dependent on seed pulse wavelength.

With the above in mind, Applicants disclose a Master Oscillator-Power Amplifier Drive Laser with Pre-Pulse for EUV Light Source.

SUMMARY

As disclosed herein, in a first aspect, a device is disclosed which may comprise: an optical amplifier having a gain band including wavelengths $\lambda_1$ and $\lambda_2$, with $\lambda_1 \neq \lambda_2$; a pre-pulse seed laser having a tuning module for tuning a pre-pulse output to wavelength $\lambda_1$; a main pulse seed laser generating a laser output having wavelength, $\lambda_2$; and a beam combiner for directing the pre-pulse output and the main pulse output on a common path through the optical amplifier.

In one embodiment, the tuning module may comprise a grating.

In a particular embodiment, the pre-pulse seed laser and the main pulse seed laser may have a gain media comprising $CO_2$, and $\lambda_1$ and $\lambda_2$ correspond to rotational lines in a common vibrational branch.

In one implementation, the pre-pulse seed laser and the main pulse seed laser may have a gain media comprising $CO_2$, and $\lambda_1$ and $\lambda_2$ correspond to rotational lines in different vibrational branches.

In a particular implementation, the pre-pulse seed laser and the main pulse seed laser may have gain media comprising $CO_2$, and $\lambda_1$ and $\lambda_2$ correspond to rotational lines in different vibrational branches and wherein the vibrational branches do not share a common upper level.

In one arrangement, the pre-pulse seed laser may comprise a sub-atmospheric, sealed, radio-frequency discharge, $CO_2$ laser.

In another aspect, also disclosed herein, a device for irradiating a target material to produce Extreme Ultraviolet (EUV) light may comprise: an optical amplifier having a gain band including wavelengths and $\lambda_2$, with $\lambda_1 \neq \lambda_2$; a pre-pulse seed laser generating a pre-pulse output having wavelength, $\lambda_1$, and pulse energy, $E_{PP}$; a main pulse seed laser generating a main pulse output having wavelength, $\lambda_2$, and pulse energy, $E_{MP}$, with $E_{MP} < 1000 \times E_{PP}$; and a beam combiner for directing the pre-pulse output and the main pulse output onto a common beam path through the optical amplifier.

In one embodiment of this aspect, the pre-pulse laser may comprise a tuning module.

In a particular embodiment, the tuning module may comprise a grating.

In a particular implementation of this aspect, the pre-pulse seed laser and the main pulse seed laser may have gain media comprising $CO_2$, and $\lambda_1$ and $\lambda_2$ correspond to rotational lines in the same vibrational branch.

In a particular implementation, the optical amplifier may have a gain media comprising $CO_2$ and produce a pre-pulse amplifier output pulse energy, $E_{PP\text{-}AMPED}$ and a main pulse amplifier output pulse energy, $E_{PP\text{-}AMPED}$ with $E_{MP\text{-}AMPED} > 10 \times E_{PP\text{-}AMPED}$.

In one implementation of this aspect, $E_{MP} < 10 \times E_{PP}$.

In one particular implementation, the pre-pulse seed laser may comprise a sub-atmospheric, sealed, radio-frequency discharge, $CO_2$ laser.

In a particular implementation of this aspect, the pre-pulse seed laser and the main pulse seed laser may have gain media comprising $CO_2$, and $\lambda_1$ and $\lambda_2$ correspond to rotational lines in the different vibrational branches.

In a particular implementation of this aspect, the pre-pulse seed laser and the main pulse seed laser have gain media comprising $CO_2$, and $\lambda_1$ and $\lambda_2$ correspond to rotational lines in different vibrational branches and the vibrational branches do not share a common upper level.

In another aspect, also disclosed herein, a device may comprise: an optical amplifier having a gain media comprising $CO_2$, a pre-pulse seed laser generating a pre-pulse output to wavelength $\lambda_1$, a main pulse seed laser generating a main pulse output having wavelength, $\lambda_2$, with $\lambda_1 \neq \lambda_2$, and $\lambda_1$ and $\lambda_2$ correspond to rotational lines in the same $CO_2$ gain media vibrational branch; and a beam combiner for directing the pre-pulse output and the main pulse output on a common path through the optical amplifier.

In a particular implementation of this aspect, the seed laser may comprise a tuning module for tuning the pre-pulse output to wavelength $\lambda_1$.

In one particular implementation of this aspect, the tuning module may comprise a grating.

In one implementation of this aspect, the pre-pulse seed laser may comprise a sub-atmospheric, sealed, radio-frequency discharge, $CO_2$ laser.

In a particular implementation of this aspect, the beam combiner may comprise a dichroic beam combiner and the $\lambda_1$ and $\lambda_2$ are separated by at least three rotational lines in the vibrational branch.

BRIEF DESCRIPTION OF THE DRAWINGS

FIGS. 13-16 show TABLES 1-4 which include selected data for rotational lines in the 9R, 10R, 9P and 10P vibrational branches.

DETAILED DESCRIPTION

Figure 1:
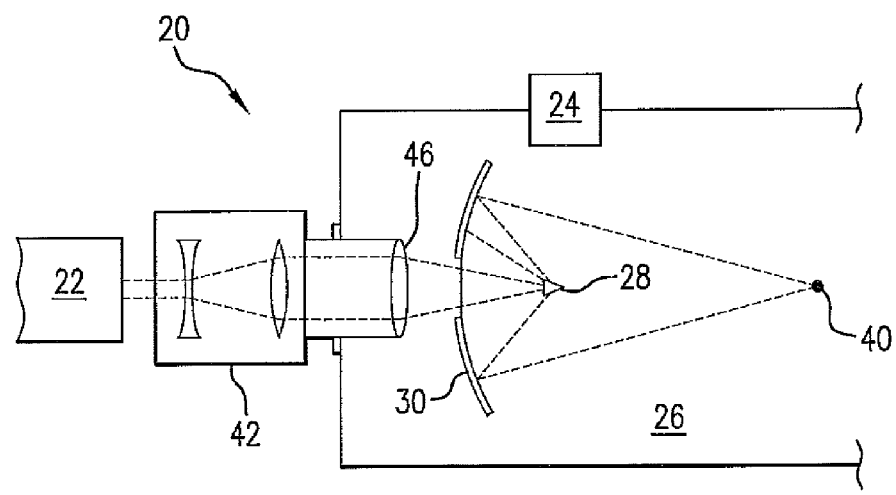
FIG. 1 shows a simplified schematic view of a laser-produced plasma EUV light source according to an aspect of the present disclosure.

With initial reference to FIG. 1, there is shown a simplified, schematic view of an embodiment of an EUV light source, e.g., a laser-produced-plasma EUV light source 20. As shown in FIG. 1, the LPP light source 20 may include a system 22 for generating light and delivering the light into a chamber 26. For the source 20, light may travel along one or more beam paths from the system 22 and into the chamber 26 to illuminate a respective target droplet at an irradiation region 28. Examples of laser arrangements that may be suitable for use in the system 22 shown in FIG. 1 are described in more detail below.

As further shown in FIG. 1, the EUV light source 20 may also include a target material delivery system 24, e.g., delivering droplets of a target material into the interior of a chamber 26 to the irradiation region 28, where the droplets will interact with one or more light pulses, e.g., zero, one or more pre-pulses and thereafter one or more main pulses, to ultimately produce plasma and generate an EUV emission. More details regarding various droplet dispenser configurations and their relative advantages may be found in U.S. patent application Ser. No. 12/721,317, filed on Mar. 10, 2010, entitled LASER PRODUCED PLASMA EUV LIGHT SOURCE; U.S. Ser. No. 12/214,736, filed on Jun. 19, 2008, entitled SYSTEMS AND METHODS FOR TARGET MATERIAL DELIVERY IN A LASER PRODUCED PLASMA EUV LIGHT SOURCE; U.S. patent application Ser. No. 11/827,803, filed on Jul. 13, 2007, entitled LASER PRODUCED PLASMA EUV LIGHT SOURCE HAVING A DROPLET STREAM PRODUCED USING A MODULATED DISTURBANCE WAVE; U.S. patent application Ser. No. 11/358,988, filed on Feb. 21, 2006, entitled LASER PRODUCED PLASMA EUV LIGHT SOURCE WITH PRE-PULSE, and published on Nov. 16, 2006 as US2006/0255298A-1; U.S. patent application Ser. No. 11/067,124, filed on Feb. 25, 2005, entitled METHOD AND APPARATUS FOR EUV PLASMA SOURCE TARGET DELIVERY; now U.S. Pat. No. 7,405,416, issued on Jul. 29, 2008; and U.S. patent application Ser. No. 11/174,443, filed on Jun. 29, 2005, entitled LPP EUV PLASMA SOURCE MATERIAL TARGET DELIVERY SYSTEM, now U.S. Pat. No. 7,372,056, issued on May 13, 2008; the contents of each of which are hereby incorporated by reference.

The target material may include, but is not necessarily limited to, a material to that includes tin, lithium, xenon or combinations thereof. The EUV emitting element, e.g., tin, lithium, xenon, etc., may be in the form of liquid droplets and/or solid particles contained within liquid droplets. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the target material may be presented to the irradiation region 28 at various temperatures including room temperature or near room temperature (e.g., tin alloys, $SnBr_4$), at an elevated temperature, (e.g., pure tin) or at temperatures below room temperature, (e.g., $SnH_4$), and in some cases, can be relatively volatile, e.g., $SnBr_4$. More details concerning the use of these materials in an LPP EUV light source is provided in U.S. patent application Ser. No. 11/406,216, filed on Apr. 17, 2006, entitled ALTERNATIVE FUELS FOR EUV LIGHT SOURCE, now U.S. Pat. No. 7,465,946, issued on Dec. 16, 2008, the contents of which are hereby incorporated by reference herein.

Continuing with FIG. 1, the EUV light source 20 may also include an optic 30 such as a near-normal incidence collector mirror having a reflective surface in the form of a prolate spheroid (i.e., an ellipse rotated about its major axis) having, e.g., a graded multi-layer coating with alternating layers of Molybdenum and Silicon, and in some cases, one or more high temperature diffusion barrier layers, smoothing layers, capping layers and/or etch stop layers. FIG. 1 shows that the optic 30 may be formed with an aperture to allow the light pulses generated by the system 22 to pass through and reach the irradiation region 28. As shown, the optic 30 may be, e.g., a prolate spheroid mirror that has a first focus within or near the irradiation region 28 and a second focus at a so-called intermediate region 40, where the EUV light may be output from the EUV light source 20 and input to a device utilizing EUV light, e.g., an integrated circuit lithography tool (not shown). It is to be appreciated that other optics may be used in place of the prolate spheroid mirror for collecting and directing light to an intermediate location for subsequent delivery to a device utilizing EUV light, for example, the optic may be a parabola rotated about its major axis or may be configured to deliver a beam having a ring-shaped cross-section to an intermediate location, see e.g., U.S. patent application Ser. No. 11/505,177, filed on Aug. 16, 2006, entitled EUV OPTICS, the contents of which are hereby incorporated by reference.

FIG. 1 also shows that the source 20 may include a beam conditioning unit 42 having one or more optics for expanding, steering, pulse shaping and/or shaping the beam between the system 22 and a focusing unit 46. An optical isolator (not shown) may also be provided to protect the system 22. Further details regarding beam conditioning are provided in U.S. patent application Ser. No. 10/803,526, filed on Mar. 17, 2004, entitled A HIGH REPETITION RATE LASER PRODUCED PLASMA EUV LIGHT SOURCE, now U.S. Pat. No. 7,087,914, issued on Aug. 8, 2006; U.S. Ser. No. 10/900,839 filed on Jul. 27, 2004, entitled EUV LIGHT SOURCE, now U.S. Pat. No. 7,164,144, issued on Jan. 16, 2007, and U.S. patent application Ser. No. 12/638,092, filed on Dec. 15, 2009, entitled BEAM TRANSPORT SYSTEM FOR EXTREME ULTRAVIOLET LIGHT SOURCE, the contents of each of which are hereby incorporated by reference.

For the source 22, the focusing unit 46 may include one or more optics for focusing a beam to a focal spot at the irradiation site. For example, the focusing unit may include one or more mirrors, lenses, achromats such as an achromatic doublet or combinations thereof.

As used herein, the term "optic" and its derivatives includes, but is not necessarily limited to, one or more components which reflect and/or transmit and/or operate on incident light and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, neither the term "optic" nor its derivatives, as used herein, are meant to be limited to components which operate solely or to advantage within one or more specific wavelength range(s) such as at the EUV output light wavelength, the irradiation laser wavelength, a wavelength suitable for metrology or some other wavelength.

Figure 2:
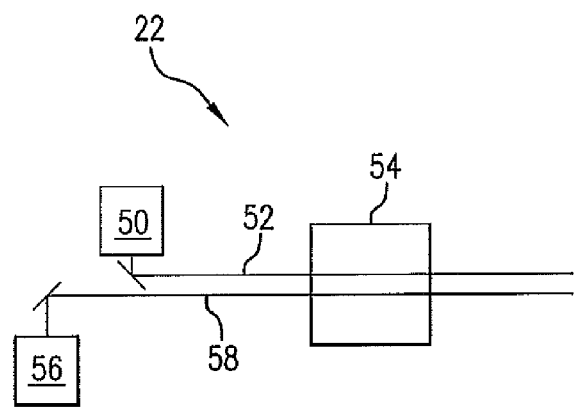
FIG. 2 shows a simplified schematic of an embodiment of a laser source having a pre-pulse seed laser, main pulse seed laser and common amplifier.

FIG. 2 shows an example of a laser source 22 for use in the light source 20 shown in FIG. 1. As shown in FIG. 2, the laser source 22 may include a pre-pulse seed laser 50 producing an output that is directed onto a beam path 52 through common amplifier 54 and a main pulse seed laser 56 producing an output that is directed onto a beam path 58 through common amplifier 54. In some cases, an optical isolator (not shown) may be provided between the amplifier and seed lasers to protect the seed lasers.

Figure 3:
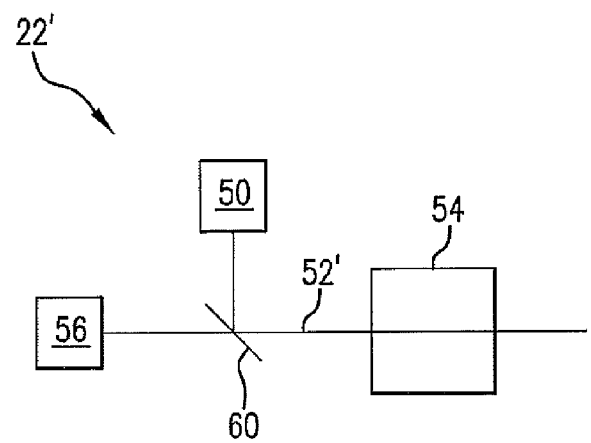
FIG. 3 shows a simplified schematic of another embodiment of a laser source having a pre-pulse seed laser, main pulse seed laser and common amplifier.

FIG. 3 shows another example of a laser source 22' for use in the light source 20 shown in FIG. 1. As shown in FIG. 3, the laser source 22' may include a pre-pulse seed laser 50 producing an output that is directed onto a common beam path 52' after reflection from optic 60 and through common amplifier 54 and a main pulse seed laser 56 producing an output that is directed through optic 60 onto common beam path 58 and through common amplifier 54. For the arrangement shown in FIG. 3, the optic 60 may be a dichroic beam combiner, polarization discriminating beam combiner or partially reflecting beam combiner. It is to be appreciated that the arrangement may be modified such that the pre-pulse seed laser output is transmitted through the optic 60 and the main pulse seed laser output is reflected by the optic 60.

Figure 4:
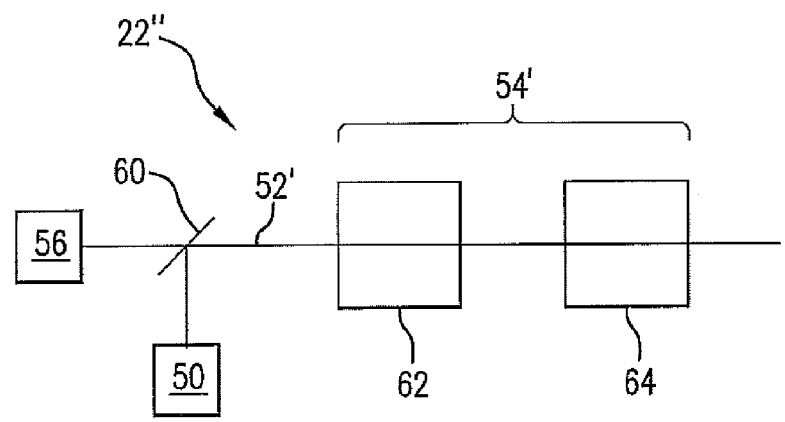
FIG. 4 shows a simplified schematic of another embodiment of a laser source having a pre-pulse seed laser, main pulse seed laser and common amplifier.

FIG. 4 shows another example of a laser source 22" for use in the light source 20 shown in FIG. 1. As shown in FIG. 4, the laser source 22" may include a pre-pulse seed laser 50 producing an output that is directed onto a common beam path 52' after reflection from optic 60 and through common amplifier 54' and a main pulse seed laser 56 producing an output that is directed through optic 60 onto common beam path 52' and through common amplifier 54'. As further shown, amplifier 54' may have two (or more) amplification units 62, 64, each having a chamber with its own active media and excitation source, e.g. pumping electrodes. For the arrangement shown in FIG. 3, the optic 60 may be a dichroic beam combiner, polarization discriminating beam combiner or partially reflecting beam combiner. It is to be appreciated that the arrangement may be modified such that the pre-pulse seed laser output is transmitted through the optic 60 and the main pulse seed laser output is reflected by the optic 60.

Figure 5:
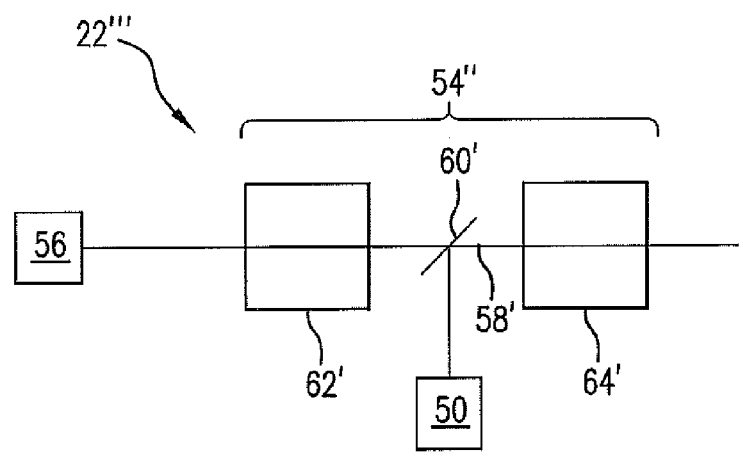
FIG. 5 shows a simplified schematic of another embodiment of a laser source having a pre-pulse seed laser, main pulse seed laser and common amplifier.

FIG. 5 shows another example of a laser source 22''' for use in the light source 20 shown in FIG. 1. As shown in FIG. 5, the laser source 22''' may include an amplifier 54" having two (or more) amplification units 62', 64', each having its own active media and excitation source, e.g. pumping electrodes. As further shown, a pre-pulse seed laser 50 may be provided producing an output that is directed onto a common beam path 58' after reflection from optic 60' and through common amplification unit 64', FIG. 5 also shows that a main pulse seed laser 56 may be provided producing an output that is directed through amplification unit 64' and then through optic 60' onto common beam path 58' and through common amplifier 54'. For the arrangement shown in FIG. 3, the optic 60' may be a dichroic beam combiner, polarization discriminating beam combiner or partially reflecting beam combiner. It is to be appreciated that the arrangement may be modified such that the pre-pulse seed laser output is transmitted through the optic 60' and the main pulse seed laser output is reflected by the optic 60'. It is to be further appreciated that more than one amplification unit may be positioned between the optic 60' and main pulse seed laser 56 and/or more than one shared amplification unit may be positioned on common beam path 58' to amplify both the pre-pulse seed laser output and the output of the amplification unit 62'.

Figure 6:
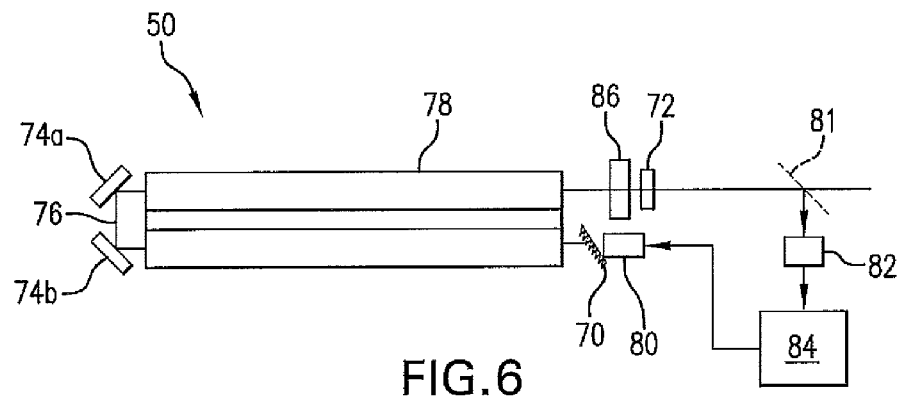
FIG. 6 shows a simplified schematic of an embodiment of a wavelength tunable pre-pulse seed laser.

FIG. 6 shows a simplified schematic of an embodiment of a wavelength tunable pre-pulse seed laser 50. As shown, the pre-pulse seed laser 50 may include an optical cavity defined by a grating 70, output coupler 72, mirrors 74a,b and beam path 76. As further shown, beam path 76 may pass through active media 78. For the arrangement, the output coupler may be a partially reflective optic and the grating 70 may be a blazed, eschelle type grating disposed in a Littrow arrangement relative to the incident beam. For the pre-pulse seed laser 50, an actuator 80 may be provided to rotate the grating 70 and change the center wavelength of the pre-pulse seed laser output. For example, the actuator may include a stepper motor, piezoelectric element/stack or a combination stepper motor/piezoelectric. Other actuator designs are possible. It is to be appreciated that other arrangements may be substituted for the grating in Littrow configuration such as a prism/mirror arrangement, an intra-cavity etalon or a grating/mirror combination.

FIG. 6 further shows that an optic 81 such as a partially reflective beam splitter or pickoff mirror may be provided to direct a diagnostic portion of the pre-pulse seed laser output beam to a detector 82. The detector 82 may output a signal indicative of center wavelength to a control circuit 84, which may, in turn, may generate a control signal to drive the actuator 80. FIG. 6 further shows that a switch 86 such as an acousto-optic modulation (AOM) switch may be provided to control the quality, Q, of the optical cavity and provide a pulsed laser output at pulse repetition rates in the range of 20-150 khz.

In one setup, the pre-pulse seed laser 50 may be a $CO_2$ laser having a sealed gas including $CO_2$ at sub-atmospheric pressure, e.g. 0.05-0.2 atm, that is pumped by a radio-frequency discharge. With this arrangement, the grating may rotated to tune the pre-pulse seed laser 50 to one of the rotational lines shown in Tables 1-4.

Figure 7:
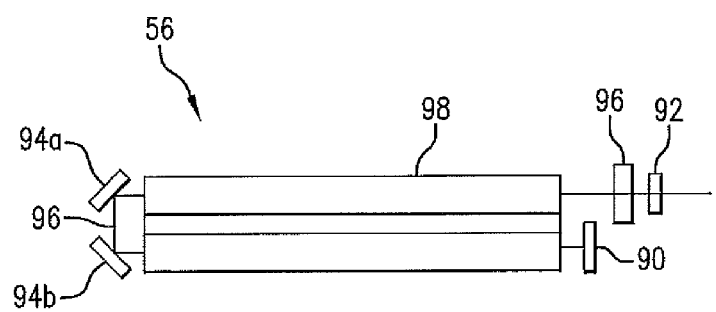
FIG. 7 shows a simplified schematic of an embodiment of a main pulse seed laser.

The tunable seed laser embodiment shown in FIG. 6 may also be used as the main-pulse seed laser 56 in the arrangement shown in FIGS. 2-5 or the more simplified laser 56 embodiment shown in FIG. 7 may be used. As shown there, the main pulse seed laser 56 may include an optical cavity defined by a fully reflective rear mirror 90, output coupler 92, mirrors 94a,b and beam path 96. As further shown, beam path 96 may pass through active media 98. For the arrangement, the output coupler 92 may be a partially reflective optic. FIG. 7 further shows that a switch 96 such as an acousto-optic modulation (AOM) switch may be provided to control the quality, Q, of the optical cavity and provide a pulsed laser output at pulse repetition rates in the range of 20-150 khz.

In one setup, the main pulse seed laser 56 may be a $CO_2$ laser having a sealed gas including $CO_2$ at sub-atmospheric pressure, e.g. 0.05-0.2 atm, that is pumped by a radio-frequency discharge. With this arrangement, the main pulse seed laser may self-tune to one of the dominant lines such as the 10P(20) line having wavelength 10.5910352 (see Tables 1-4). In some instances, an actuator (not shown) may be provided to move the rear mirror 90 to prevent mode-hopping.

Referring back to FIGS. 2-5, it can be seen that each arrangement includes an amplifier 54, 54', 54", having one or more amplification units 54, 62, 64, 62', 64'. For the case where the pre-pulse seed laser 50 and main pulse seed laser 56 include active media including $CO_2$ described above, suitable lasers for use as amplification units 54, 62, 64, 62', 64' may include an active media containing $CO_2$ gas that is pumped by DC or RF excitation. In one particular implementation, the amplifier may include a plurality, such as three or four, axial-flow, RF-pumped (continuous or with pulse modulation) $CO_2$ amplification units having a total gain length of about 10-25 meters, and operating, in concert, at relatively high power, e.g., 10 kW or higher. Other types of amplification units having fiber, rod, slab or disk-shaped active media may be used. In some cases, a solid active media may be employed.

Figure 8:
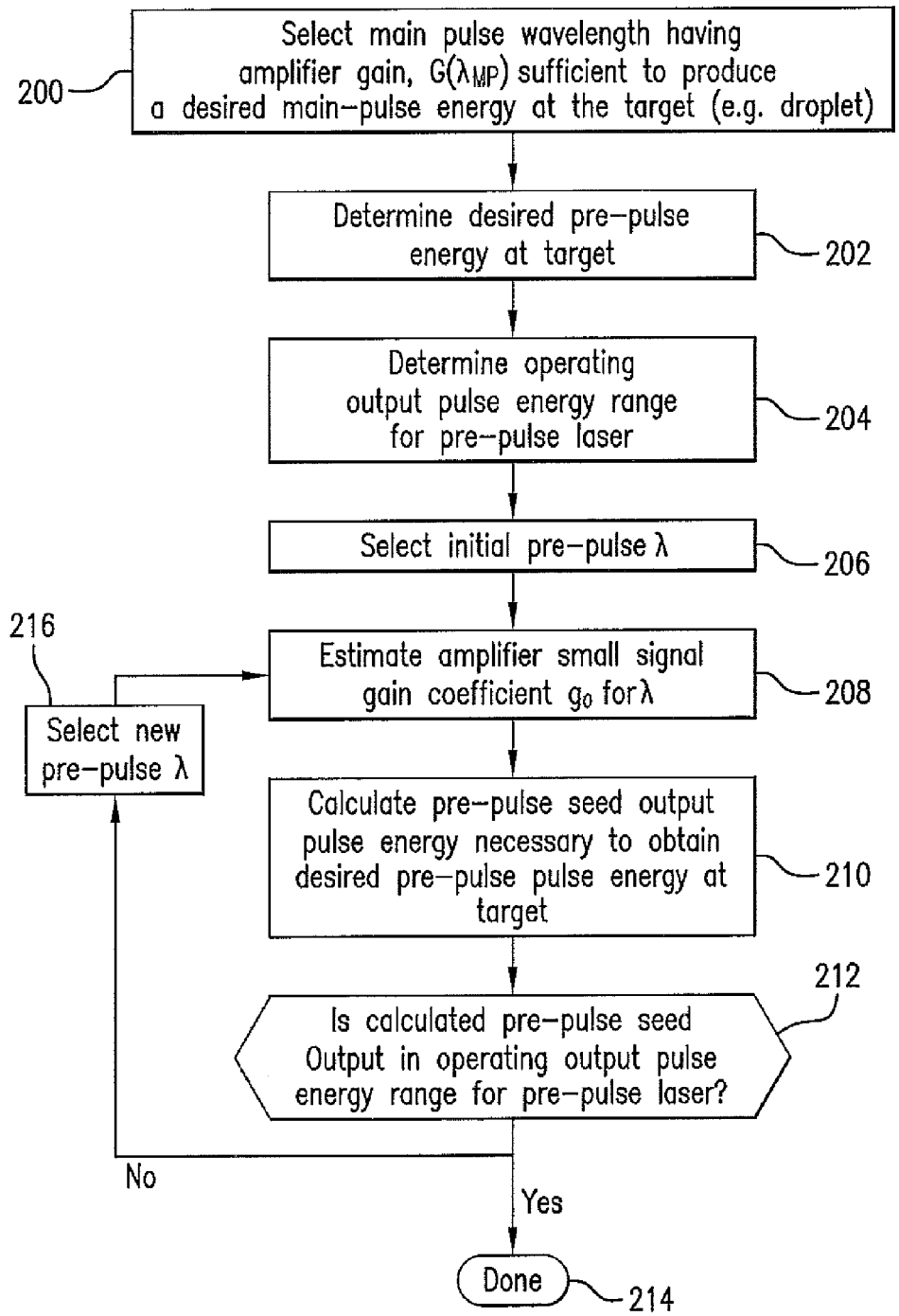
FIG. 8 shows an example of an operational procedure for determining an output wavelength, $\lambda_{PP}$ for a pre-pulse seed laser.

FIG. 8 shows an example of an operational procedure for determining an output wavelength, $\lambda_{PP}$ for a pre-pulse seed laser (although FIG. 8 shows an arrangement of steps in a particular order, it is to be appreciated that the order of some or all of the steps may be modified without adversely affecting the outcome of the procedure). With this in mind, the procedure may begin by first selecting a main pulse wavelength, $\lambda_{MP}$), [box 200]. For example, as indicated above, it may be convenient to use a main pulse seed laser that can generate high-power when passed through an amplifier and that self-tunes to a dominant wavelength, such as 10P(20) line, obviating the need for a seed laser tuning mechanism. With $\lambda_{MP}$ selected, the amplifier gain, $G(\lambda_{MP})$ needed to produce a desired main-pulse energy at the target, e.g. droplet, may be established. This, in turn, determines the small signal gain band for the amplifier, and in particular, the expected amplifier gain, G, for each pre-pulse seed laser wavelength.

Tables 1-4 (shown in FIGS. 13-16) show estimated small signal gain coefficient values, $g_O$, for selected $CO_2$ rotational lines. More specifically, Tables 1-4 show wavelengths for rotational lines in the 9R vibrational branch, 10R vibrational branch, 9P vibrational branch and 10P vibrational branch, respectively, together with published output power for each rotational line for a typical $CO_2$ laser. From these data, power, P, relative to the power of a wavelength with a known amplifier small signal gain, (SSG), such as 10P(20), $P_{10P(20)}$ may be calculated (see e.g. Table 1; column 4) for each rotational line. Table 1 also shows that the small signal gain relative to a selected line, in this case the (10P20) line, may be calculated (column 5) using a Rigrod analysis as:

$$I_{out} \alpha I_{sat} \times [2g_o L_{cavity} - \ln(1/R_1 R_2)]$$

where $L_{cavity}$ is the optical cavity length and $R_1$ and $R_2$ are the mirror reflectivities for the typical $CO_2$ laser. Specifically, noting that I=P/A where I is intensity and A is the area of the output beam, the relative gain (i.e. ratio of $I_{out,selected\ line}$ to $I_{out,10P20}$) shown in column 5 of Tables 1-4 may be calculated from the relative power (column 4 of Tables 1-4) as follows:

$$\frac{I_{out,selected\ line}}{I_{out,10P20}} = \frac{I_{sat,selected\ line} \times [2g_{o,selected\ line} L_{cavity} - \ln(1/R_1 R_2)]}{I_{sat,10P20} \times [2g_{o,10P20} L_{cavity} - \ln(1/R_1 R_2)]}$$

Assuming that $I_{sat,selected\ line}/I_{sat,10P20}$ is approximately one, the expression above can then be solved to find $g_{o,selected\ line}$ for each line since is it assumed that $g_{o,10P20}$ is known. With this small signal gain coefficient, $g_o$, the amplifier gain, G, can be calculated using the expression;

$$G = \exp[g_o L]$$

where L is the length of the amplifier gain media. The above analysis assumes that the general shape of the small signal gain band for different types of $CO_2$ lasers is approximately the same. An alternative approach may involve measuring the small signal gain coefficient, $g_o$ for particular lines of interest in the specific amplifier being used.

Continuing with FIG. 8, it can be seen that a next procedural step may include determining the desired pre-pulse energy at the source material target (e.g. droplet) [box 202]. For example, a desired main pulse energy at target may be in the range of about 300-700 mJ and desired pre-pulse energy at target may be in the range of about 6-12 mJ for a tin droplet having a diameter in the range of about 10-100 μm. It is to be appreciated that these desired energies may be adjusted for a variety of factors such as the size of the target material droplet and corresponding pre-pulse and main pulse focal spot size, the level of accuracy that is achievable in targeting the droplet with the pre-pulse, the delay between pre-pulse and main pulse, the pre-pulse and main-pulse pulse durations, the pre-pulse wavelength, the desired level of EUV output energy, desired conversion efficiency (CE) and desired reflectivity of the pre-pulsed (puffed) plasma.

Next, as shown in FIG. 8 [box 204], it may be suitable to determine an operating range for the particular type pre-pulse seed laser that will be employed. Specifically, this may entail determining the range of output pulse energies that can be achieved after considering laser component limitation and/or stable laser operation. It is to be appreciated that a number of factors may influence the type pre-pulse seed laser including cost, complexity, efficiency, reliability, laser pulse parameters such as rise time, duration, etc. In some configurations, the pre-pulse seed laser 50 described above with reference to FIG. 6 may have a pulse energy output operating range of about 0.01-1000 μJ. Some arrangements may be further limited to a pulse energy output range of about 0.1 to 100 μJ. Depending on the type of seed laser used, there may be other limitations on seed-laser pulse energy output.

Boxes [208]-[216] suggest a trial and error approach to selecting the pre-pulse wavelength $\lambda_{PP}$ once the amplifier(s) has been optimized for maximum energy extraction for main-pulse amplification and pre-pulse operating range have been established. As shown, this may involve selecting an initial pre-pulse λ for analysis [box 208], estimating the amplifier small signal gain coefficient $g_o$ and amplifier gain, G for the selected λ [box 210] using the approach described above with reference to Tables 1-4. Next, the pre-pulse seed output pulse energy $E_{PP\text{-}SEED}$ necessary to obtain desired pre-pulse pulse energy at target $E_{PP\text{-}TARGET}$ can be calculated [box 210] as:

$$E_{PP\text{-}SEED} = E_{PP\text{-}TARGET}/G$$

and compared to the output pulse energy operating range for the pre-pulse laser [decision box 212]. If the selected pre-pulse seed output pulse energy $E_{PP\text{-}SEED}$ is within the output pulse energy operating range [box 214], the selected pre-pulse, λ, is suitable. On the other hand, if the selected pre-pulse seed output pulse energy $E_{PP\text{-}SEED}$ is outside the output pulse energy operating range, the selected pre-pulse, λ, is unsuitable and another pre-pulse wavelength is analyzed [box 216] by re-performing boxes [208], [210] and [212]. This process is then repeated, as necessary, until a suitable pre-pulse wavelength is obtained.

The following example illustrates the procedure described above for an amplifier having four amplification units. In some arrangements, the amplification units may differ in gain length, gas composition, gas pressure, etc., and thus may have different small signal gain coefficients, $g_o$ and saturation energies, $E_{sat}$, see for example U.S. patent application Ser. No. 11/452,558 filed on Jun. 14, 2006, entitled DRIVE LASER FOR EUV LIGHT SOURCE; the contents of which are hereby incorporated by reference. For this example, a main-pulse wavelength, $\lambda_{MP}$ of 10.5910354 μm corresponding to the 10P(20) line and selected and main-pulse target energy of 500 mJ is specified. With these selections, the gain curves can be measured and the Frantz-Nodvik fit parameters $G_0$ and $E_{sat}$ can be calculated for each of the four amplification units, since it is assumed that one or more of the amplification units will be saturated by the main-pulse. Working backward from the target, the required input energies for the fourth, third, second and then first amplification unit can be calculated using Frantz-Nodvik fit parameters $G_0$ and $E_{sat}$. For example, in one arrangement of an amplifier having four rf discharge, axial flow amplification units of total length 16 m, the input required at the first amplification unit (i.e. the main-pulse seed laser output) was calculated to be 20 μJ. The calculated Frantz-Nodvik fit parameters $G_0$ for each amplification unit can also be added to obtain the total small signal gain, $G(\lambda_{MP})$ for the amplifier at the selected main-pulse wavelength $\lambda_{MP}$. Once the small signal amplifier gain $G(\lambda_{MP})$ for the main-pulse is determined, portions or all of the amplifier small signal gain band can be estimated using the procedure provided above in conjunction with the description of Table 1. Continuing with the specific example of an amplifier having four rf discharge, axial flow amplification units of total length 16 m, a total small signal gain, $G(\lambda_{MP})$ was calculated to be about $6.926 \times 10^7$.

Also, for this example, a pre-pulse at target energy of 10 mJ is specified and a pulse energy output operating range of 0.01-1000 μJ is set. Using the procedure shown in FIG. 8, an initial pre-pulse λ of 9.2824434 μm corresponding to line 9R(18) may be selected, As shown in Table 1 the estimated small signal gain coefficient of 1.064936811 can be used to calculate the small signal gain, SSG (λ) in the amplifier of 2.47 E 07. With this small signal gain, it can be seen that the pre-pulse seed energy required to produce a target energy of 10 mJ is about 4 E-04 μJ, which is outside the pulse energy output operating range of 0.01-1000 μJ. Accordingly, per FIG. 8, another pre-pulse λ is selected. For example, pre-pulse λ of 9.3417579 μm corresponding to line 9R(8) may be selected, As shown in Table 1 the estimated small signal gain coefficient of 0.661695687 can be used to calculate the small signal gain, SSG (λ) in the amplifier of 3.962 E 04. With this small signal gain, it can be seen that the pre-pulse seed energy required to produce a target energy of 10 mJ is about 2.5 E 01 μJ which is within the pulse energy output operating range of 0.01-1000 μJ.

Figure 9:
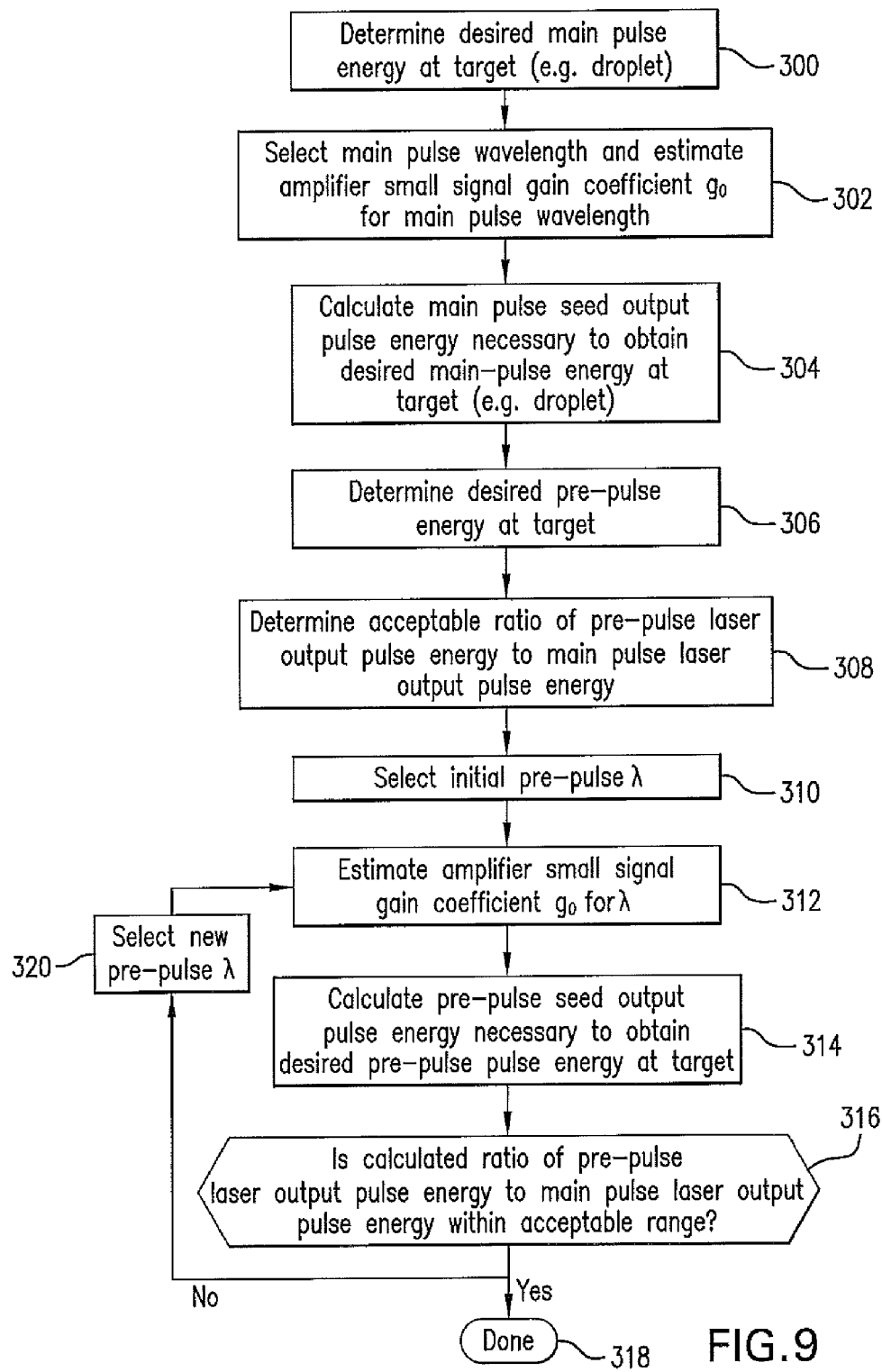
FIG. 9 shows another example of an operational procedure for determining an output wavelength, $\lambda_{PP}$ for a pre-pulse seed laser.

FIG. 9 shows another example of an operational procedure for determining an output wavelength, $\lambda_{PP}$ for a pre-pulse seed laser (although FIG. 9 shows an arrangement of steps in a particular order, it is to be appreciated that the order of some or all of the steps may be modified without adversely affecting the outcome of the procedure). The operational procedure shown in FIG. 9 may be used alone to determine an output wavelength, $\lambda_{PP}$ for a pre-pulse seed laser, or may be used together with the procedure of FIG. 8. For example, when a plurality of pre-pulse wavelengths have been found to be acceptable using the procedure in FIG. 8, these wavelengths may then be further processed with the procedure of FIG. 9 to determine a pre-pulse wavelength which is suitable under both procedures.

The procedure of FIG. 9 may begin by first selecting a desired main-pulse energy at the target [box 300] and a main pulse wavelength, $\lambda_{MP}$, [box 302]. For example, as indicated above, it may be convenient to use a main pulse seed laser that can generate high-power when passed through an amplifier and that self-tunes to a dominant wavelength, such as 10P(20) line, obviating the need for a seed laser tuning mechanism. With $\lambda_{MP}$ selected, the main pulse seed output and amplifier gain, $G(\lambda_{MP})$ needed to produce a desired main-pulse energy at the target, e.g. droplet, may be established [box 304]. This, as described above, allows estimation of the small signal gain band for the amplifier, and in particular, the expected amplifier gain, G, for each pre-pulse seed laser wavelength.

Continuing with FIG. 9, it can be seen that a next procedural step may include determining the desired pre-pulse energy at the source material target (e.g. droplet) [box 306]. For example, a desired main pulse energy at target may be in the range of about 300-700 mJ and desired pre-pulse energy at target may be in the range of about 6-12 mJ for a tin droplet having a diameter in the range of about 10-100 µm. As described above, the desired target energies may be adjusted for a variety of factors.

Next, as shown [box 308] in FIG. 9, it may be suitable to determine an acceptable ratio of pre-pulse laser output pulse energy to main pulse laser output pulse energy. In some cases, adherence to an acceptable ratio may provide that the pre-pulse seed output does not substantially deplete the amplifier gain of the main pulse wavelength.

For example, an acceptable ratio of pre-pulse laser output pulse energy to main pulse laser output pulse energy $E_{PP}/E_{MP}<1000$ and in some cases, an acceptable ratio of pre-pulse laser output pulse energy to main pulse laser output pulse energy may be more tightly defined such as $E_{PP}/E_{MP}<10$. Also, for these ratios, it is contemplated that the pre-pulse amplifier output pulse energy, $E_{PP-AMPED}$ is less than the main pulse amplifier output pulse energy $E_{MP-AMPED}$ by an order of magnitude or more, i.e. $E_{MP-AMPED}>10\times E_{PP-AMPED}$.

Continuing with the procedure of FIG. 9, Boxes [310]-[320] suggest a trial and error approach to selecting the pre-pulse wavelength $\lambda_{PP}$ once the amplifier gain band and acceptable ratio of pre-pulse laser output pulse energy to main pulse laser output pulse energy have been established. As shown, this may involve selecting an initial pre-pulse λ for analysis [box 310], estimating the amplifier small signal gain coefficient $g_o$ and amplifier gain, G for the selected λ [box 312] using the approach described above with reference to Tables 1-4. Next, the pre-pulse seed output pulse energy $E_{PP-SEED}$ necessary to obtain desired pre-pulse pulse energy at target $E_{PP-TARGET}$ can be calculated [box 314] as:

$$E_{PP-SEED}=E_{PP-TARGET}/G$$

With the pre-pulse seed output pulse energy calculated [Box 314] and the main pulse seed energy calculated [Box 304] their ratio can be determined and compared to acceptable ratio of pre-pulse laser output pulse energy to main pulse laser output pulse energy [Box 316].

If the ratio is within the acceptable range [box 318], the selected pre-pulse, λ, is suitable. On the other hand, if the ratio is outside the acceptable range, the selected pre-pulse, λ, is unsuitable and another pre-pulse wavelength is analyzed [box 320] by re-performing boxes [312], [314] and [316]. This process is then repeated, as necessary, until a suitable pre-pulse wavelength is obtained.

As an alternative to the procedure of FIG. 9, a minimum pre-pulse seed energy may be identified such that main-pulse gain depletion is acceptable. The minimum pre-pulse seed energy may then be substituted for the acceptable ratio of pre-pulse laser output pulse energy to main pulse laser output pulse energy in the procedure of FIG. 9.

Another factor that may be considered in conjunction with FIGS. 8, 9 or their combination, is the effect on gain depletion that occurs when the pre-pulse wavelength and main pulse wavelength share a common upper energy level. When this happens, main pulse gain depletion due to pre-pulse amplification is generally higher than when the pre-pulse wavelength and main pulse wavelength do not share a common upper energy level. For the $CO_2$ laser, all rotational lines in the 9R vibrational branch and all rotational lines in the 10R vibrational branch share a common upper level. Also, all rotational lines in the 9P vibrational branch and all rotational lines in the 10P vibrational branch share a common upper level.

Another factor that may be considered when selecting main pulse and pre-pulse wavelengths is the use of dichroic splitters and combiners. In this regard, a minimum wavelength difference such as about 0.14 µm may be required between the main pulse and pre-pulse wavelength to obtain >90% of combining efficiency by the dichroic optic.

Figure 10:
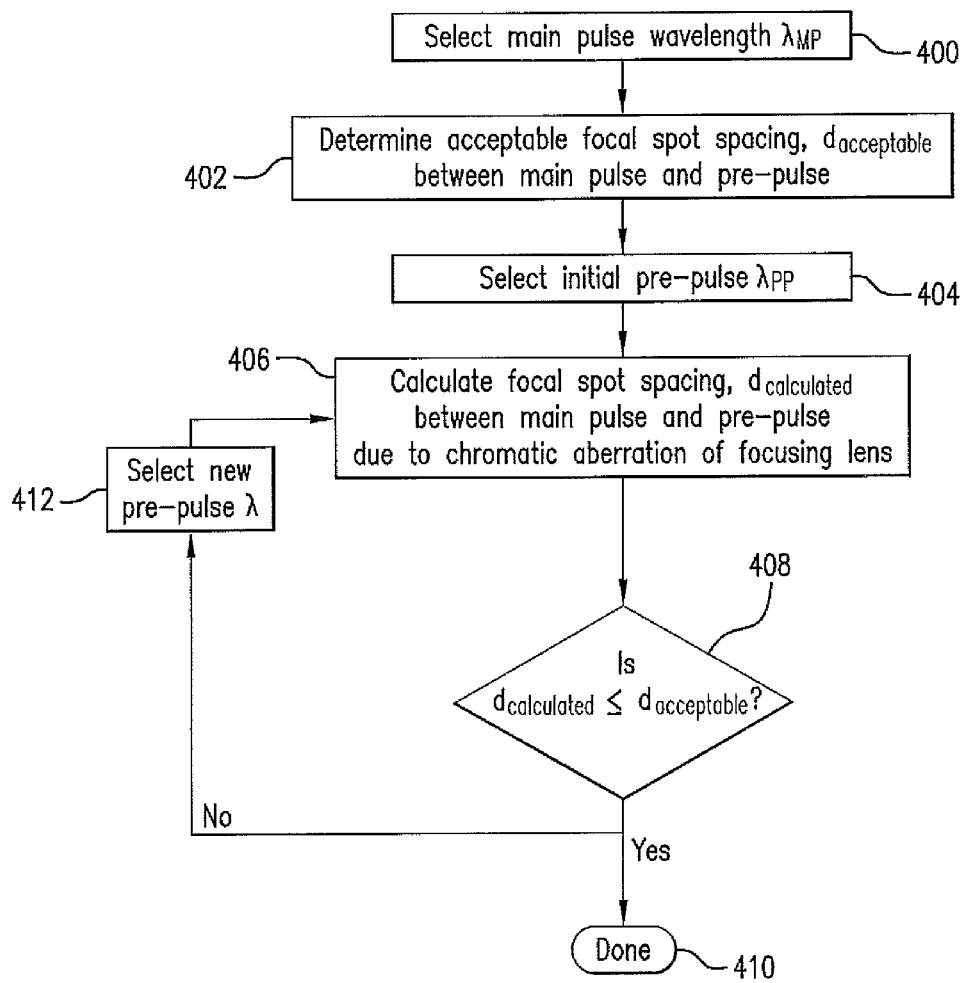
FIG. 10 shows another example of an operational procedure for determining an output wavelength, $\lambda_{PP}$ for a pre-pulse seed laser when a focusing lens is used to focus the amplifier output on a target.

FIG. 10 shows another example of an operational procedure for determining an output wavelength, $\lambda_{PP}$ for a pre-pulse seed laser when a focusing lens is used to focus the amplifier output on a target, e.g. droplet (although FIG. 10 shows an arrangement of steps in a particular order, it is to be appreciated that the order of some or all of the steps may be modified without adversely affecting the outcome of the procedure). The operational procedure shown in FIG. 10 may be used alone to determine an output wavelength, $\lambda_{PP}$ for a pre-pulse seed laser, or may be used together with the procedures of FIG. 8 or FIG. 9, or both. In addition, the factors described immediately above may be considered in the selection of a suitable pre-pulse wavelength, $\lambda_{PP}$.

Figure 11:
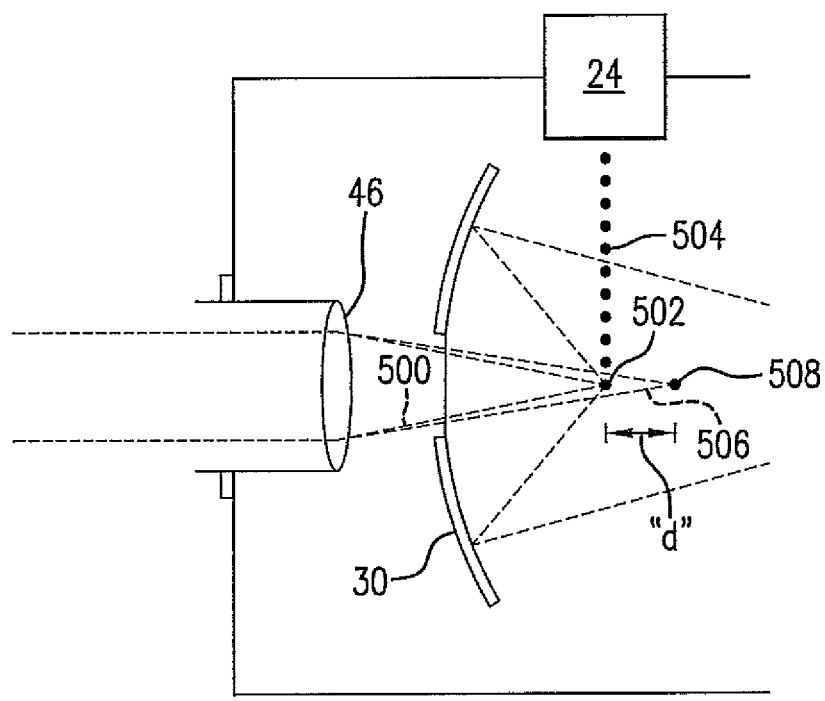
FIG. 11 illustrates that chromatic aberration may cause pre-pulse light beam having wavelength $\lambda_1$ to focus at a first location while main pulse light beam having wavelength $\lambda_2$ focuses at a second location which is distanced from the first location by a distance "d"

The procedure of FIG. 10 may begin by first selecting a main pulse wavelength, $\lambda_{MP}$, [box 400]. For example, as indicated above, it may be convenient to use a main pulse seed laser that can generate high-power when passed through an amplifier and that self-tunes to a dominant wavelength, such as 10P(20) line, obviating the need for a seed laser tuning mechanism. Cross-referencing FIGS. 10 and 11, it can be seen that with $\lambda_{MP}$ selected, an acceptable focal spot spacing, $d_{acceptable}$ between main pulse and pre-pulse due to chromatic aberration by focusing optic 46 may be determined [Box 402]. For the arrangement shown in FIG. 11, focusing optic 46 may include at least one lens or other element which introduces chromatic aberration. As shown in FIG. 11, chromatic aberration may cause pre-pulse light beam 500 having wavelength $\lambda_1$ to focus at location 502 along droplet path 504 while main pulse light beam 506 having wavelength $\lambda_2$ focuses at location 508 which is distanced from location 502 by "d".

Figure 12:
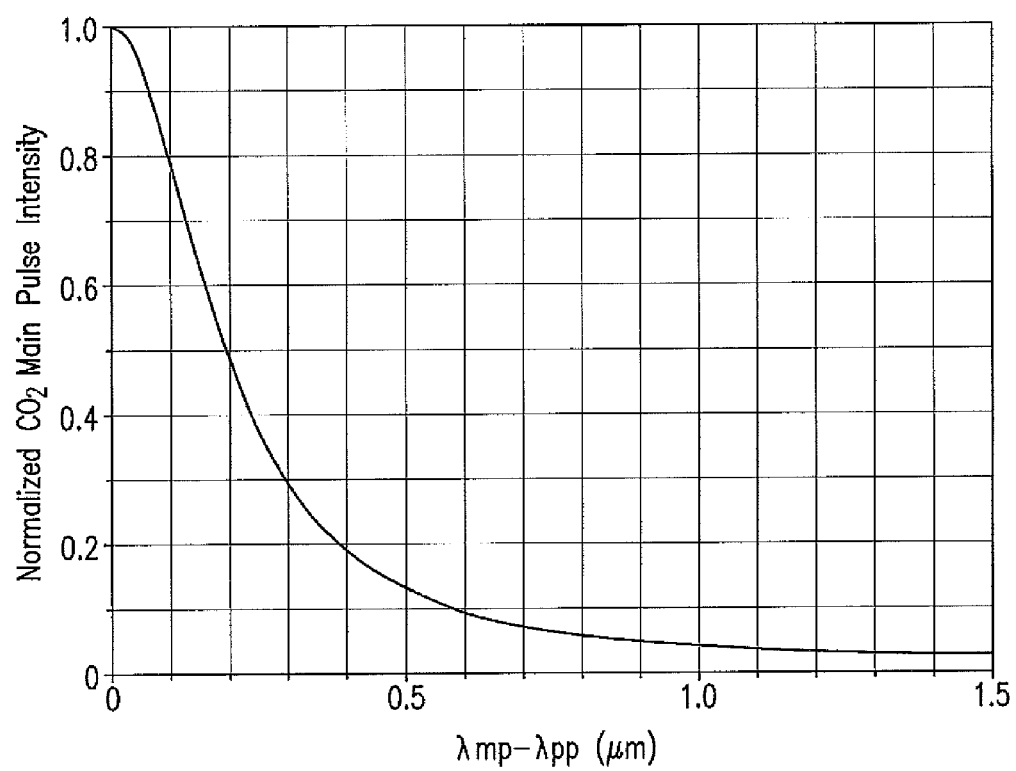
FIG. 12 shows a graph of main pulse laser intensity on target (droplet) plotted against wavelength difference between pre-pulse and main-pulse ($\lambda_{MP}$-$\lambda_{PP}$) for a typical LPP system having a focusing lens.

Outside of an acceptable spacing, "d" EUV output may be reduced due to a decrease of main-pulse intensity on the source material. FIG. 12 shows a graph of main pulse intensity a droplet plotted against wavelength difference between pre-pulse and main-pulse ($\lambda_{MP}-\lambda_{PP}$) for a typical LPP system having a ZnSe focusing lens with clear aperture of 96 mm and focal length of 300 mm. From FIG. 12, it can be seen that normalized CO2 intensity on target drops to 0.8 for a $\lambda_{MP}-\lambda_{PP}$ of about 0.1 µm. Another suitable range for $\lambda_{MP}-\lambda_{PP}$ may be about 0.2 µm where normalized CO2 output intensity drops to 0.5. Drop in the CO2 intensity will reduce the EUV throughput with lower CE due to a lower than optimal CO2 intensity on target. Also a larger focal spot size also indicates poor energy coupling from laser to target material. Both results from chromatic dispersion are undesirable for EUV power generation. In some instances, the selected distance, $d_{acceptable}$, may depend on the pre-plasma expansion speed, optimal delay between prepulse and main pulse, and the intensity of prepulse and main pulse.

Referring back to FIG. 10, once an acceptable focal spot spacing, $d_{acceptable}$ between main pulse and pre-pulse due to chromatic aberration is determined, boxes [404]-[412] suggest a trial and error approach to selecting the pre-pulse wavelength $\lambda_{PP}$. As shown, this may involve selecting an initial pre-pulse λ for analysis [box 404], Next, the focal spot spacing, $d_{calculated}$ between main pulse and pre-pulse due to chromatic aberration of focusing lens may be calculated [Box 406]. If $d_{calculated} \leq d_{acceptable}$ [Box 408] the selected pre-pulse, λ, is suitable [Box 410]. On the other hand, if $d_{calculated} > d_{acceptable}$, the selected pre-pulse, λ, is unsuitable and another pre-pulse wavelength is analyzed [box 412] by re-performing boxes [406] and [408]. This process is then repeated, as necessary, until a suitable pre-pulse wavelength is obtained.

It will be understood by those skilled in the art that the embodiments described above are intended to be examples only and are not intended to limit the scope of the subject matter which is broadly contemplated by the present application. It is to be appreciated by those skilled in the art that additions, deletions and modifications may be made to the disclosed embodiments within the scope of the subject matter disclosed herein. The appended claims are intended in scope and meaning to cover not only the disclosed embodiments but also such equivalents and other modifications and changes that would be apparent to those skilled in the art. Unless explicitly stated otherwise, reference to an element in the following Claims in the singular or a reference to an element preceded by the article "a" is intended to mean "one or more" of said element(s), None of the disclosure provided herein is intended to be dedicated to the public regardless of whether the disclosure is explicitly recited in the Claims.

We claim:

1. A method for generating EUV light by irradiating targets using at least a main pulse seed laser and a pre-pulse seed laser, comprising:
    determining main pulse wavelength at said targets;
    determining desired pre-pulse energy at said targets;
    iteratively testing different output wavelengths for said pre-pulse seed laser until a satisfactory output wavelength for said pre-pulse seed laser is obtained, wherein said testing involves at least one of assessing resultant pre-pulse seed energy, assessing a ratio of said pre-pulse seed energy to main pulse seed energy, and assessing chromatic-aberration related focal spot spacing, and wherein said main pulse wavelength is different from said satisfactory output wavelength for said pre-pulse seed laser; and
    employing said satisfactory output wavelength for said pre-pulse seed laser to generate said EUV light.

2. The method of claim 1 wherein said testing involves said assessing said resultant pre-pulse seed energy.

3. The method of claim 2 wherein said assessing said resultant pre-pulse seed energy comprises performing steps A, B, and C for each output wavelength tested, wherein step A includes estimating amplifier small signal gain coefficient g0, step B comprises calculating pre-pulse seed output pulse energy necessary to obtain said pre-pulse seed pulse energy at said target, and step C comprises ascertaining whether the calculated pre-pulse seed output pulse energy in an operating energy range for said pre-pulse seed laser.

4. The method of claim wherein said testing involves said assessing said ratio of resultant pre-pulse seed energy to main pulse seed energy.

5. The method of claim 4 wherein said assessing said ratio of resultant pre-pulse seed energy to main pulse seed energy comprises determining acceptable ratio of pre-pulse laser output pulse energy to main pulse laser output pulse energy, said assessing said ratio of resultant pre-pulse seed energy to main pulse seed energy further comprises determining whether a calculated ratio of pre-pulse laser output pulse energy to main pulse laser output pulse energy for a given wavelength being tested is within an acceptable range.

6. The method of claim 1 wherein said testing involves said assessing said chromatic-aberration related focal spot spacing.

7. The method of claim 6 wherein said chromatic-aberration related focal spot spacing pertains to a focal spot spacing between a focal spot of a laser beam emitted by said main pulse seed laser and a focal spot of a laser beam emitted by said pre-pulse seed laser.

8. The method of claim 7 wherein at least one of said main pulse seed laser and a said pre-pulse seed laser employs a gain media that comprises CO2.

9. The method of claim 1 wherein said pre-pulse seed laser includes at least a tuning module for tuning said pre-pulse seed laser to different pre-pulse seed laser wavelengths.

10. The method of claim 1 wherein said targets comprise tin-containing droplets.

11. A method for determining an output wavelength for a pre-pulse seed laser, said pre-pulse seed laser being employed for irradiating targets to generate EUV light in a system having a main pulse laser and a pre-pulse seed laser, comprising:
    determining main pulse wavelength at said targets;
    determining desired pre-pulse energy at said targets; and
    iteratively testing different output wavelengths for said pre-pulse seed laser until a satisfactory output wavelength for said pre-pulse seed laser is obtained, wherein said testing involves at least one of assessing resultant pre-pulse seed energy, assessing a ratio of said pre-pulse seed energy to main pulse seed energy, and assessing chromatic-aberration related focal spot spacing, and wherein said main pulse wavelength is different from said satisfactory output wavelength for said pre-pulse seed laser.

12. The method of claim 11 wherein said testing involves said assessing said resultant pre-pulse seed energy.

13. The method of claim 12 wherein said assessing said resultant pre-pulse seed energy comprises performing steps A, B, and C for each output wavelength tested, wherein step A includes estimating amplifier small signal gain coefficient g0, step B comprises calculating pre-pulse seed output pulse energy necessary to obtain said pre-pulse seed pulse energy at said target, and step C comprises ascertaining whether the calculated pre-pulse seed output pulse energy in an operating energy range for said pre-pulse seed laser.

14. The method of claim 11 wherein said testing involves said assessing said ratio of resultant pre-pulse seed energy to main pulse seed energy.

15. The method of claim 14 wherein said assessing said ratio of resultant pre-pulse seed energy to main pulse seed energy comprises determining acceptable ratio of pre-pulse laser output pulse energy to main pulse laser output pulse energy, said assessing said ratio of resultant pre-pulse seed energy to main pulse seed energy further comprises determining whether a calculated ratio of pre-pulse laser output pulse energy to main pulse laser output pulse energy for a given wavelength being tested is within an acceptable range.

16. The method of claim 11 wherein said testing involves said assessing said chromatic-aberration related focal spot spacing.

17. The method of claim 16 wherein said chromatic-aberration related focal spot spacing pertains to a focal spot spacing between a focal spot of a laser beam emitted by said main pulse seed laser and a focal spot of a laser beam emitted by said pre-pulse seed laser.

18. The method of claim 17 wherein at least one of said main pulse seed laser and a said pre-pulse seed laser employs a gain media that comprises $CO_2$.

19. The method of claim 11 wherein said pre-pulse seed laser includes at least a tuning module for tuning said pre-pulse seed laser to different pre-pulse seed laser wavelengths.

* * * * *